United States Patent
Zhu et al.

(10) Patent No.: US 10,034,413 B2
(45) Date of Patent: Jul. 24, 2018

(54) AIR DEFLECTION PLUG-IN BOX FOR FORCED AIR-COOLED CABINET AND FORCED AIR-COOLED CABINET

(71) Applicant: ZTE Corporation, Shenzhen (CN)

(72) Inventors: Shouli Zhu, Shenzhen (CN); Mingjian Yu, Shenzhen (CN); Jian Li, Shenzhen (CN); Jiapeng Dai, Shenzhen (CN); Jiazheng Xu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 110 days.

(21) Appl. No.: 14/899,910

(22) PCT Filed: May 23, 2014

(86) PCT No.: PCT/CN2014/078344
§ 371 (c)(1),
(2) Date: Dec. 18, 2015

(87) PCT Pub. No.: WO2014/183702
PCT Pub. Date: Nov. 20, 2014

(65) Prior Publication Data
US 2016/0143180 A1 May 19, 2016

(30) Foreign Application Priority Data
Aug. 9, 2013 (CN) .......................... 2013 1 0347191

(51) Int. Cl.
*H05K 7/20* (2006.01)
(52) U.S. Cl.
CPC ......... *H05K 7/206* (2013.01); *H05K 7/20554* (2013.01); *H05K 7/20572* (2013.01)
(58) Field of Classification Search
CPC . H05K 7/206; H05K 7/20554; H05K 7/20572
(Continued)

(56) References Cited

U.S. PATENT DOCUMENTS 6,885,554 B1 * 4/2005 Reeck ............... H05K 7/20572
361/695
8,605,435 B1 * 12/2013 Ashby ..................... G06F 1/20
361/690
(Continued)

FOREIGN PATENT DOCUMENTS

| CN | 201315730 Y | 9/2009 |
| CN | 102457161 A | 5/2012 |

(Continued)

OTHER PUBLICATIONS

European Search Report for corresponding application EP 14 79 8578; dated Jun. 30, 2016.

(Continued)

*Primary Examiner* — Steven B McAllister
*Assistant Examiner* — Allen Schult
(74) *Attorney, Agent, or Firm* — Cantor Colburn LLP (57) ABSTRACT

The disclosure discloses an air deflection plug-in box for a forced air-cooled cabinet. The air deflection plug-in box includes a front vertical plate with one or more vent holes, a rear vertical plate with one or more vent holes, two side vertical plates with hangers and an air deflection diaphragm arranged to isolate air areas, wherein the front vertical plate, the rear vertical plate, the two side vertical plates and the air deflection diaphragm are fixedly connected into a whole to distinctively guide cold airflow on one side of the air deflection diaphragm and guide hot airflow on the other side of the air deflection diaphragm. One or more thermal barriers are also arranged on at least one surface of the air deflection diaphragm, and each thermal barrier is made from thermal insulation material.

10 Claims, 5 Drawing Sheets

(58) Field of Classification Search
USPC ......................................................... 454/184
See application file for complete search history.

(56) References Cited

U.S. PATENT DOCUMENTS

2005/0022967 A1* 2/2005 Hall .................. H05K 7/20572
                                                                                          165/80.2
2008/0068798 A1* 3/2008 Hendrix ................ H05K 7/206
                                                                                         361/696

FOREIGN PATENT DOCUMENTS

| CN | 202979509 U | 6/2013 |
|----|-------------|--------|
| CN | 103209555 A | 7/2013 |
| GB | 2387716 A | 10/2003 |

OTHER PUBLICATIONS

International Search Report for corresponding application PCT/CN2014/078344 filed o May 23, 2014; dated Aug. 8, 2014.

* cited by examiner

AIR DEFLECTION PLUG-IN BOX FOR FORCED AIR-COOLED CABINET AND FORCED AIR-COOLED CABINET

TECHNICAL FIELD

The disclosure relates to the communication cabinets field, and in particular to an air deflection plug-in box for a forced air-cooled cabinet and the forced air-cooled cabinet.

BACKGROUND

In the related art, a forced air-cooled cabinet includes one or more functional plug-in boxes and one or more air deflection plug-in boxes, which are alternately stacked. Heating electronic components and fans arranged at top ends or bottom ends of the functional plug-in boxes are mounted in each functional plug-in box. An air deflection diaphragm, which divides each air deflection plug-in box into two areas, is arranged in each air deflection plug-in box, an area on one side of the air deflection diaphragm is a channel for sucking cold air suction passage of one functional plug-in box, and an area on the other side is a channel for exhausting hot air of another functional plug-in box. Along with increase of functions of the functional plug-in boxes, heat power consumption increases. The air deflection diaphragm is baked by hot air exhausted by the functional plug-in box on one side of the air deflection diaphragm, which causes high temperature of the air deflection diaphragm, thereby heating air on the other side of the air deflection diaphragm and make a functional plug-in box on the other side of the air deflection diaphragm to suck heated air to cause a poor radiation effect of the functional plug-in box on the other side of the air deflection diaphragm.

SUMMARY

A main purpose of the embodiments of the disclosure is to provide an air deflection plug-in box for a forced air-cooled cabinet and the forced air-cooled cabinet, so as to fulfil the aim of enhancing radiation effect by improving the structure of the air deflection plug-in box.

An embodiment of the disclosure provides an air deflection plug-in box for a forced air-cooled cabinet, wherein the air deflection plug-in box includes a front vertical plate with one or more vent holes, a rear vertical plate with one or more vent holes, two side vertical plates with hangers and an air deflection diaphragm arranged to isolate air areas, wherein the front vertical plate, the rear vertical plate, the two side vertical plates and the air deflection diaphragm are fixedly connected into a whole to distinctively guide cold airflow on one side of the air deflection diaphragm and guide hot airflow on the other side of the air deflection diaphragm, one or more thermal barriers are also arranged on at least one surface of the air deflection diaphragm, and each thermal barrier is made from thermal insulation material.

In an example embodiment, a thermal barrier is arranged on each surface of the air deflection diaphragm.

In an example embodiment, one end, connected with the front vertical plate, of the air deflection diaphragm is lower than another end, connected with the rear vertical plate, of the air deflection diaphragm.

In an example embodiment, a thickness of the thermal barrier on each surface of the air deflection diaphragm gradually increases along a direction from a region near the front vertical plate to a region distant from the front vertical plate.

In an example embodiment, thermal barriers are arranged on inner side surfaces of parts, which guide the cold airflow, of the two side vertical plates.

In an example embodiment, one or more vent holes are arranged in surfaces of parts, which guide the hot airflow, of the two side vertical plates.

In an example embodiment, at least one sound absorber is arranged on one or more the inner side surfaces of the air deflection plug-in box.

In an example embodiment, the at least one sound absorber is arranged on a side, close to an external fan, of the air deflection diaphragm.

The embodiment of the disclosure further provides a forced air-cooled cabinet, which includes one or more functional plug-in boxes and one or more air-deflection plug-in boxes, wherein each functional plug-in box includes an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the abovementioned air deflection plug-in box provided by the disclosure.

According to the air deflection plug-in box and the forced air-cooled cabinet disclosed by the embodiment of the disclosure, the thermal barriers are arranged on the air deflection diaphragm, thereby greatly reducing heat of hot air which heats the air deflection diaphragm and avoiding the air deflection diaphragm becoming a heat transfer medium to avoid the hot air heating cold air and achieve a better radiation effect; and in addition, the thermal insulation material is usually porous material, and also has a high sound absorption property, so that noise absorption effect is achieved.

Implementation of the purpose, functional characteristics and advantages of the disclosure are further described with reference to embodiments and the drawings.

DETAILED DESCRIPTION OF EMBODIMENTS

It should be understood that the embodiments described herein are merely illustrative of the present invention but not to be construed as limiting the disclosure.

Figure 1:
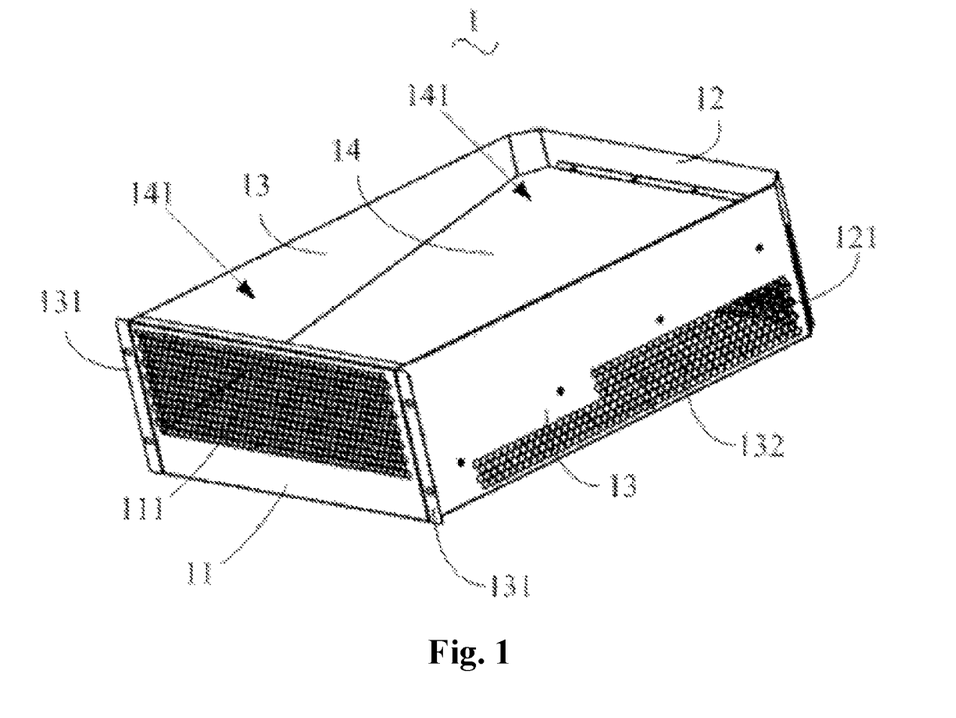
FIG. 1 is a structural diagram of an air deflection plug-in box in one direction according to a first embodiment of the disclosure.
Figure 2:
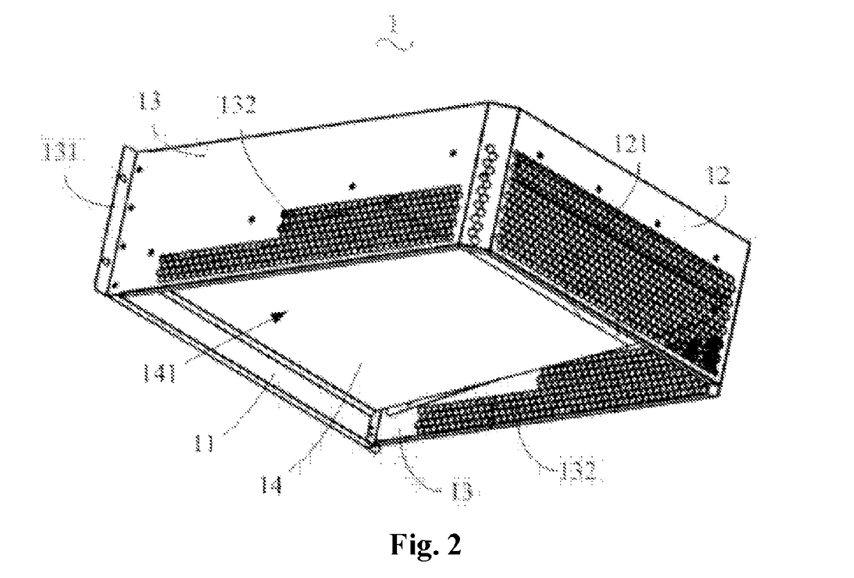
FIG. 2 is a structural diagram of the air deflection plug-in box in another direction according to the first embodiment of the disclosure.
Figure 3:
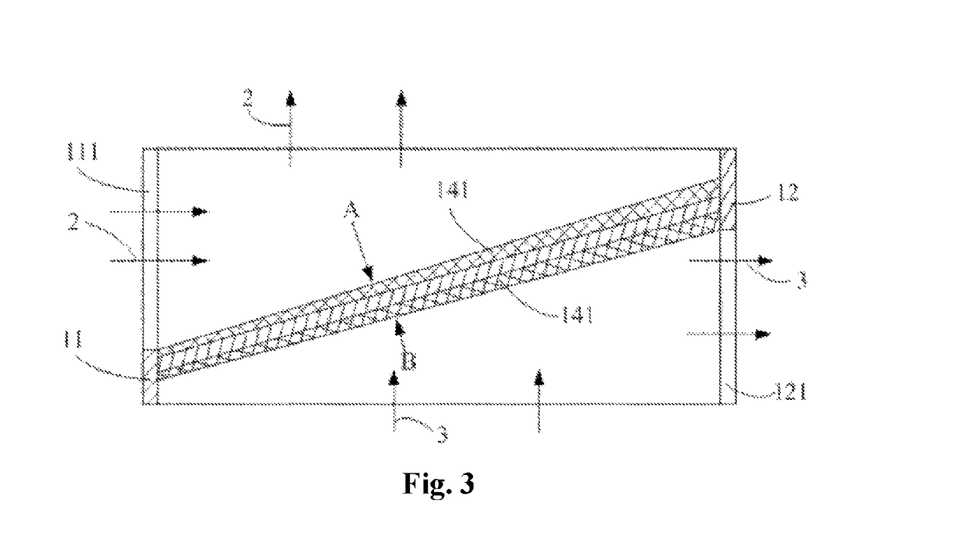
FIG. 3 is a sectional diagram of the air deflection plug-in box in a working state according to the first embodiment of the disclosure.

FIG. 1 to FIG. 3 shows a first embodiment of the disclosure. As shown in FIG. 1 and FIG. 2, an air deflection plug-in box 1 disclosed by the embodiment includes a front vertical plate 11, a rear vertical plate 12, two side vertical plates 13 and an air deflection diaphragm 14. First vent holes 111 are formed in the front vertical plate 11. Second vent holes 121 are formed in the rear vertical plate 12. A suspension loop 131 for fixation with a cabinet is arranged at one end of each of the two side vertical plates 13. As shown in FIG. 3, the air deflection diaphragm 14 includes a surface A and surface B on two opposite sides, a thermal barrier 141 is adhered to each of the surface A side and the surface B side, and the thermal barriers 141 are made from thermal insulation material. One end of the air deflection diaphragm 14 is connected with the front vertical plate 11, and the first vent holes 111 in the front vertical plate 11 are positioned in the surface A side of the air deflection diaphragm 14. The other end of the air deflection diaphragm 14 is connected with the rear vertical plate 12, and the second vent holes 121 in the rear vertical plate 12 are positioned in the surface B side of the air deflection diaphragm 14. As shown in FIG. 1 and FIG. 2, the ends, with the hangers 131, of the two side vertical plates 13 are connected with two ends of the front vertical plate 11 respectively, the other ends, with the hangers 131, of the two side vertical plates 13 are connected with two ends of the rear vertical plate 12 respectively, and inner side surfaces of the two side vertical plates 13 are connected with two opposite ends of the air deflection diaphragm 14 respectively. As shown in FIG. 3, by the abovementioned arrangement, the air deflection plug-in box 1 is divided into two areas, the area on the surface A side is a channel area for cold air through which cold air 2 flows, and the area on the surface B side is a channel area for hot air through which hot air 3 flows. Compared with the related art, the embodiment has the advantages that the thermal barriers 141 are arranged on the air deflection diaphragm 14, thereby greatly reducing heat of the hot air 3 which heats the air deflection diaphragm 14 and avoiding the air deflection diaphragm 14 becoming a heat transfer medium to avoid the hot air 3 heating the cold air 2 and achieve a better radiation effect; and in addition, the thermal insulation material is usually porous material, and also has a high sound absorption property, so that noise absorption effect is achieved.

In the embodiment, the thermal barriers 141 are arranged on both the surface A side and surface B side of the air deflection diaphragm 14, and in another embodiment, the thermal barrier 141 may also be arranged on one surface side only, and the effect of reducing heat transfer of the hot air 3 to the cold air 2 may also be achieved. Of course, in the embodiment, the area on the surface A side is the channel area for cold air through which the cold air 2 flows, and the area on the surface B side is channel area for the hot air through which the hot air 3 flows. In the other embodiment, the area on the surface A side may also be the channel area for the hot air through which the hot air flows, and the area on the surface B side may also be the channel area for the cold air passage area through which the cold air flows.

Specifically, in the embodiment, one end, connected with the front vertical plate 11, of the air deflection diaphragm 14 is lower than the other end, connected with the rear vertical plate 12, of the air deflection diaphragm, which may circulate the hot air 3 and the cold air 2 more smoothly. In the other embodiment, the air deflection diaphragm 14 may also be arranged in a manner that the two ends of the air deflection diaphragm are positioned at the same height or the end, connected with the front vertical plate 11, is higher than the other end, connected with the rear vertical plate 12, which may also achieve the effect of isolating the air areas to reduce heat transfer between the cold air 2 and the hot air 3.

As shown in FIG. 3, since flow of the hot air 3 flows through the part, close to the front vertical plate 11, of the air deflection diaphragm 14 is small, and flow of the hot air 3 flows through the part, far away from the front vertical plate 11, of the air deflection diaphragm 14 is large, temperature of the ends, close to the front vertical plate 11, of the thermal barriers 141 of the air deflection diaphragm 14 is relatively lower, and temperature of the end, far away from the front vertical plate 11, of the air deflection diaphragm is relatively higher. Therefore, in the embodiment, the thermal barriers 141 of the air deflection diaphragm 14 are arranged with thicknesses changing, and the thicknesses of the terminal barriers 141 on the surfaces of the air deflection diaphragm 14 gradually increase in a direction from the part of each thermal barrier close to the front vertical plate 11 to the part of each thermal barrier far away from the front vertical plate 11. That is, the thermal barriers 14 at positions with larger hot air volumes are thicker.

As shown in FIG. 1, thermal barriers 141 (only one is marked in FIG. 1, and the other is unmarked due to be covered) are preferably arranged on inner side surfaces of parts, positioned on the surface A side (the cold air passage area) with the thermal barrier 141, of the two side vertical plates 13 to further reduce heat transfer between the cold air 2 and the hot air 3. By such an arrangement, heat transfer to the parts on the surface A side due to heating of parts, positioned on the surface B side (the hot air channel area), of the two side vertical plates 13 by the hot air 3 may be reduced, thereby achieving the effect of reducing the heat transfer of the hot air 3 to the cold air 2.

Specifically, in the embodiment, vent holes 132 are formed in the parts, positioned on the surface B side (the hot air channel area), of the two side vertical plates 13. With the formation of the vent holes 132, a circulation area of the hot air 3 may be enlarged, thereby circulating the hot air 3 more smoothly and further improving radiation efficiency.

In the other embodiment, the surfaces of the air deflection plug-in box 1 may further be coated with the thermal barriers 141 by virtue of a coating process, an adhesion process or the like.

Figure 4:
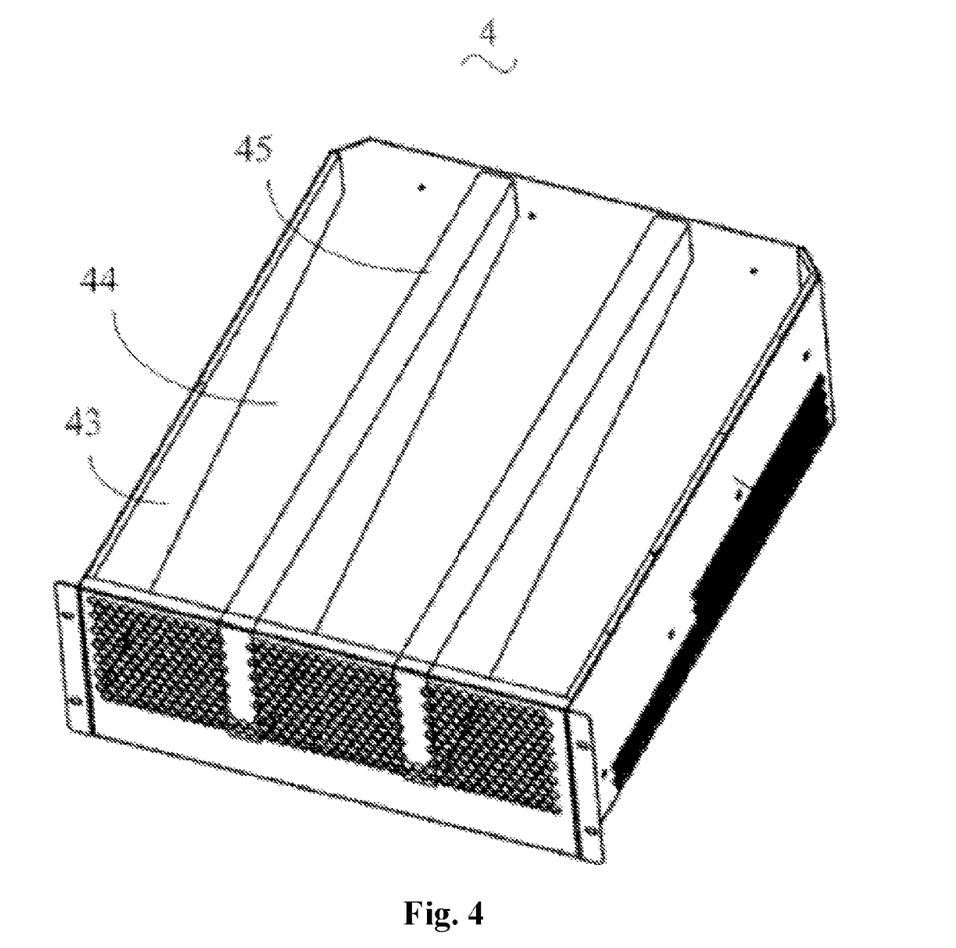
FIG. 4 is a structural diagram of the air deflection plug-in box according to a second embodiment of the disclosure.

FIG. 4 shows a second embodiment of the disclosure. An air deflection plug-in box 4 of the disclosure is additionally provided with sound absorbers 45 on the basis of the air deflection plug-in box 1 provided by the abovementioned embodiment, only structures of each sound absorber 45 are described in detail here, and the other specific structures refer to the abovementioned embodiment. Two sound absorbers 45 are arranged on one side of an air deflection diaphragm 44 of the air deflection plug-in box 4, and each of the two sound absorbers 45 is arranged to be straight strips, and are adhered to surfaces of the air deflection diaphragm 44 to absorb noise. Preferably, the two sound absorbers 45 are arranged on the side, close to an external fan, of the air deflection diaphragm 44. Of course, in the other embodiment, the sound absorbers 45 may also be arranged on inner side surfaces of side vertical plates 43, and similarly, one or three or four or more sound absorbers 45 may be arranged. Shapes of the sound absorbers 45 are not limited to straight bars, and may also be curved strips and the like.

Figure 5:
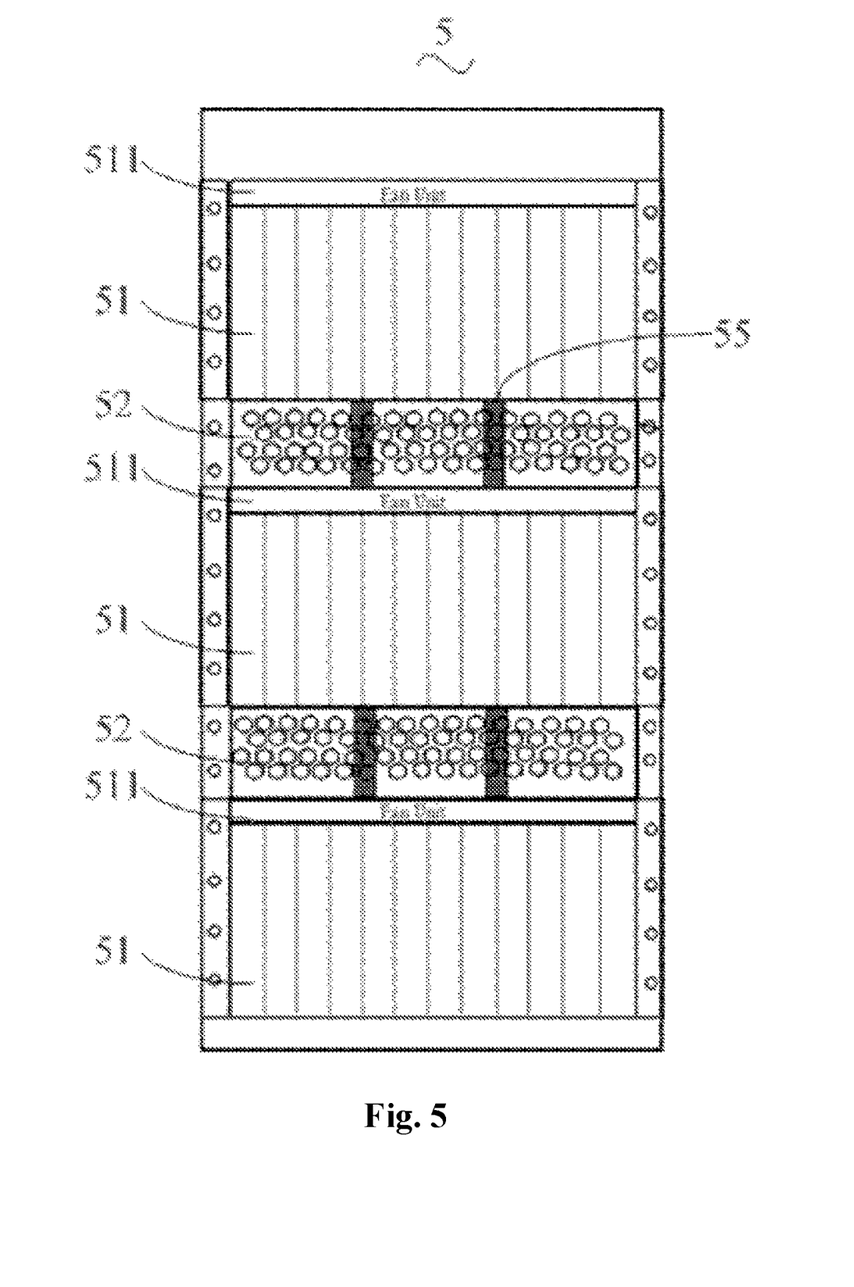
FIG. 5 is a structural diagram of a forced air-cooled cabinet according to an embodiment of the disclosure.
Figure 6:
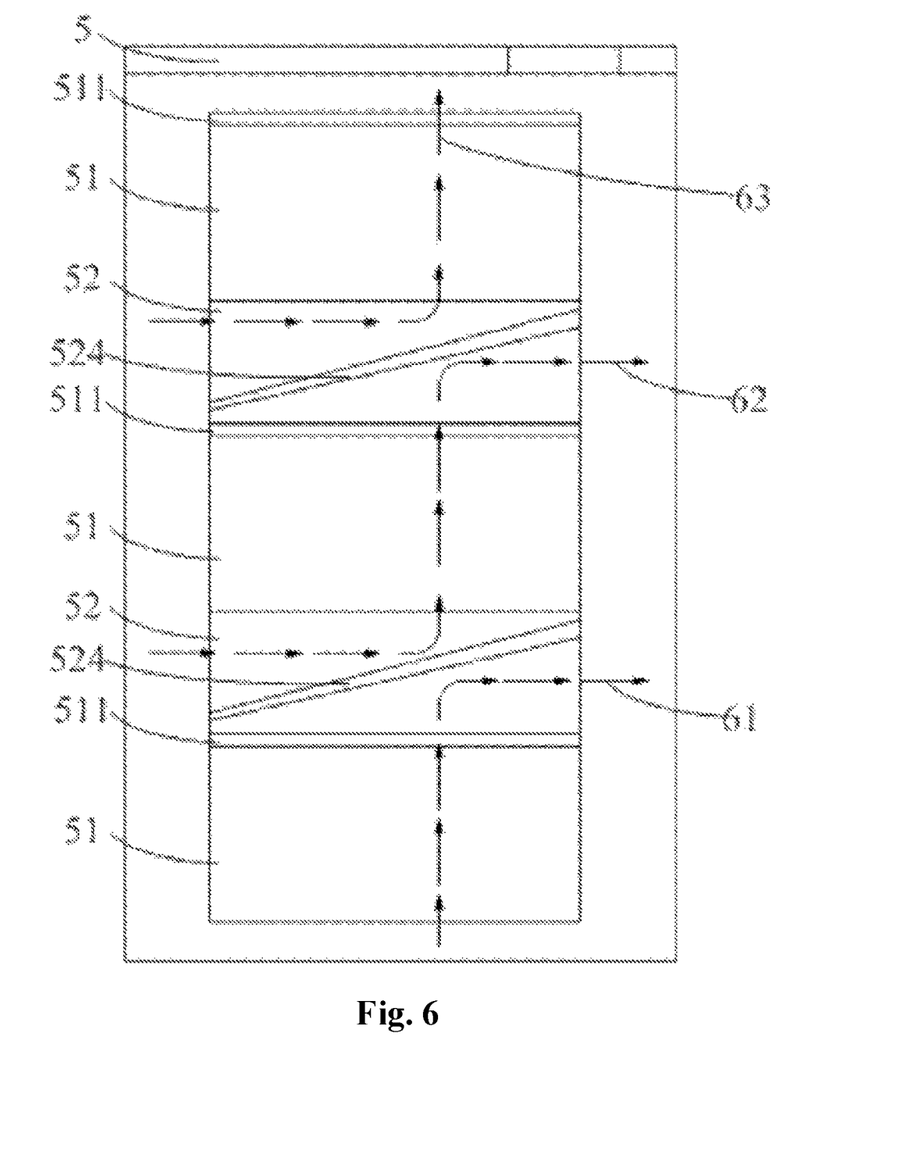
FIG. 6 is a schematic diagram of a forced air-cooled cabinet in a working state according to the disclosure.

As shown in FIG. 5, the disclosure further provides a forced air-cooled cabinet 5, which includes three functional plug-in boxes 51 and two air deflection plug-in boxes 52. Each functional plug-in boxes 51 includes a fan 511 arranged at the top end of each functional plug-in boxes 51. The air deflection plug-in boxes 52 adopt the abovementioned air deflection plug-in box 4 provided by the disclosure. Thermal barriers are arranged on air deflection diaphragms 524 of the air deflection plug-in boxes 4, and sound absorbers 55 are further arranged on lower surfaces of the air deflection diaphragms 524. The three functional plug-in boxes 51 and the two air deflection plug-in boxes 52 are alternately stacked. FIG. 6 is a schematic diagram of a forced air-cooled cabinet 5 in an air-cooled state according to the embodiment, and as shown in FIG. 6, airflow 61 is sucked in from a part below the functional plug-in box 51 in the lowest layer under the action of the fan 511 of the functional plug-in box 51, passes through the functional plug-in box 51 and carries away heat in the functional plug-in box 51. The heated airflow 61 is exhausted rightwards through the lower surface of the air deflection diaphragm 524 in the corresponding air deflection plug-in box 52 in FIG. 6. Airflow 62 is sucked in from an upper surface of the air deflection diaphragm 524 in the air deflection plug-in box 52 of the previous layer on the left side in FIG. 6 under the action of the fan 511 of the functional plug-in box 51 in a middle layer, and then the abovementioned process is repeated. A path of airflow 63 may refer to those of the airflow 61 and 62, and will not be repeated here. In the embodiment, the thermal barriers are arranged on the air deflection diaphragms 524 in the air deflection plug-in boxes 52, so that heat transfer between the airflow 61 on upper side and 62 on lower side of each air deflection diaphragm is greatly reduced. Therefore, a radiation effect of each layer of the forced air-cooled cabinet 5 is enhanced. In addition, the sound absorbers 55 are arranged in the forced air-cooled cabinet 5, and noise produced by the fans in the functional plug-in boxes 51 may be absorbed, so that noise reduction effect is achieved.

In the other embodiment, the air deflection plug-in boxes 52 in the forced air-cooled cabinet may also adopt the air deflection plug-in box 1 provided by the disclosure. Of course, the fan of each functional plug-in box 51 may also be arranged at bottom end of each functional plug-in box 51, or the airflow in the functional plug-in boxes 51 may also flow from top to bottom. Of course, the forced air-cooled cabinet 5 may also be arranged to include one air deflection plug-in box 52 and two functional plug-in boxes, or two air deflection plug-in boxes 52 and three functional plug-in boxes, or more. Detailed description is only given for the embodiment here.

The above is only the example embodiment of the disclosure and not thus intended to limit the scope of the disclosure. Equivalent structure or equivalent flow transformation made by virtue of the specification and contents of the drawings of the disclosure, or direct or indirect application of the specification and contents of the drawings of the disclosure to other related arts shall fall within the scope of protection of the disclosure.

INDUSTRIAL APPLICABILITY

The technical solution provided by the disclosure may be applied to a structure of an air deflection plug-in box for a forced air-cooled cabinet. Thermal barriers are arranged on each air deflection diaphragm, thereby greatly reducing heat of hot air which heats each air deflection diaphragm and avoiding each air deflection diaphragm becoming a heat transfer medium to avoid the hot air heating cold air and achieve better radiation effect; and in addition, thermal insulation material is usually porous material, and also has a high sound absorption property, so that noise absorption effect is achieved.

What is claimed is:

1. An air deflection plug-in box for a forced air-cooled cabinet, comprising:
    a front vertical plate with one or more vent holes,
    a rear vertical plate with one or more vent holes,
    two side vertical plates with hangers; and
    an air deflection diaphragm arranged to isolate air areas,
    wherein the front vertical plate, the rear vertical plate, the two side vertical plates and the air deflection diaphragm are fixedly connected into a whole to divide the air deflection plug-in box into a first space and a second space, and the first space and the second space are used to guide cold airflow and hot airflow respectively,
    wherein a thermal barrier is arranged on each of two surfaces, close to the first space and the second space, of the air deflection diaphragm, and each thermal barrier is made from thermal insulation material;
    wherein one end, connected with the front vertical plate, of the air deflection diaphragm is lower than another end, connected with the rear vertical plate, of the air deflection diaphragm; a thickness of the thermal barrier on each of two surfaces of the air deflection diaphragm gradually increases along a direction from a region near the front vertical plate to a region distant from the front vertical plate.

2. The air deflection plug-in box as claimed in claim 1, wherein the thermal barrier is arranged on an inner side surface of a first part, which guides the cold airflow, of each of the two side vertical plates.

3. The air deflection plug-in box as claimed in claim 2, wherein one or more vent holes are arranged in a surface of a second part, which guides the hot airflow, of each of the two side vertical plates.

4. The air deflection plug-in box as claimed in claim 2, wherein at least one sound absorber is arranged on one or more inner side surfaces of the air deflection plug-in box.

5. The air deflection plug-in box as claimed in claim 4, wherein the at least one sound absorber is arranged on a side, close to an external fan, of the air deflection diaphragm.

6. A forced air-cooled cabinet, comprising one or more functional plug-in boxes and one or more air-deflection plug-in boxes, wherein each functional plug-in box comprises an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the air deflection plug-in box as claimed in claim 1.

7. A forced air-cooled cabinet, comprising one or more functional plug-in boxes and one or more air-deflection plug-in boxes, wherein each functional plug-in box comprises an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the air deflection plug-in box as claimed in claim 2.

8. A forced air-cooled cabinet, comprising one or more functional plug-in boxes and one or more air-deflection plug-in boxes, wherein each functional plug-in box comprises an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the air deflection plug-in box as claimed in claim 3.

9. A forced air-cooled cabinet, comprising one or more functional plug-in boxes and one or more air-deflection plug-in boxes, wherein each functional plug-in box comprises an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the air deflection plug-in box as claimed in claim 4.

10. A forced air-cooled cabinet, comprising one or more functional plug-in boxes and one or more air-deflection plug-in boxes, wherein each functional plug-in box comprises an air-cooling fan arranged at a top end of the functional plug-in box or a bottom end of the functional plug-in box, the one or more functional plug-in boxes and the one or more air deflection plug-in boxes are alternately stacked, and each air deflection plug-in box is the air deflection plug-in box as claimed in claim 5.

\* \* \* \* \*